United States Patent
Kittl et al.

(10) Patent No.: US 9,941,405 B2
(45) Date of Patent: Apr. 10, 2018

(54) NANOSHEET AND NANOWIRE DEVICES HAVING SOURCE/DRAIN STRESSORS AND METHODS OF MANUFACTURING THE SAME

(71) Applicant: Samsung Electronics Co., Ltd., Suwon-si, Gyeonggi-do (KR)

(72) Inventors: Jorge A. Kittl, Austin, TX (US); Wei-E Wang, Austin, TX (US); Mark S. Rodder, Dallas, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/340,951

(22) Filed: Nov. 1, 2016

(65) Prior Publication Data

US 2017/0271514 A1  Sep. 21, 2017

Related U.S. Application Data

(60) Provisional application No. 62/311,305, filed on Mar. 21, 2016.

(51) Int. Cl.
  *H01L 29/78* (2006.01)
  *H01L 29/66* (2006.01)
  (Continued)

(52) U.S. Cl.
  CPC .... *H01L 29/7848* (2013.01); *H01L 21/30604* (2013.01); *H01L 21/32055* (2013.01);
  (Continued)

(58) Field of Classification Search
  CPC ........... H01L 29/7848; H01L 29/78618; H01L 29/66439; H01L 29/66553; H01L 29/66742; H01L 29/66977; H01L 29/16; H01L 29/165; H01L 29/41733; H01L 29/42392; H01L 29/456; H01L 29/0673; H01L 29/0676; H01L 29/0642; H01L 29/0629; H01L 21/30604; H01L 21/3086; H01L 21/32055; H01L 21/32133;
  (Continued)

(56) References Cited

U.S. PATENT DOCUMENTS 8,013,424 B2  9/2011 Okamoto
8,367,528 B2  2/2013 Bauer et al.
(Continued)

*Primary Examiner* — Dao H Nguyen
(74) *Attorney, Agent, or Firm* — Lewis Roca Rothgerber Christie LLP

(57) ABSTRACT

A method of manufacturing a nanosheet or nanowire device from a stack including an alternating arrangement of sacrificial layers and channel layers on a substrate. The method includes deep etching portions of the stack to form electrode recesses for a source electrode and a drain electrode, forming conductive passivation layers in the electrode recesses, and epitaxially growing the source and drain electrodes in the electrode recesses. Each conductive passivation layer extends at least partially along a side of one of the electrode recesses. Portions of the substrate at lower ends of the electrode recesses are uncovered by the conductive passivation layers. The source and drain electrodes are grown from the substrate and the conductive passivation layers substantially inhibit the source and drain electrodes from being grown from the channel layers.

15 Claims, 15 Drawing Sheets

(51) Int. Cl.

| | |
|---|---|
| *H01L 29/161* | (2006.01) |
| *H01L 21/306* | (2006.01) |
| *H01L 21/3205* | (2006.01) |
| *H01L 29/06* | (2006.01) |
| *H01L 29/417* | (2006.01) |
| *H01L 21/3213* | (2006.01) |
| *H01L 29/423* | (2006.01) |
| *H01L 29/16* | (2006.01) |
| *H01L 29/45* | (2006.01) |
| *H01L 29/165* | (2006.01) |
| *H01L 29/786* | (2006.01) |

(52) U.S. Cl.
CPC .... *H01L 21/32133* (2013.01); *H01L 29/0673* (2013.01); *H01L 29/16* (2013.01); *H01L 29/165* (2013.01); *H01L 29/41733* (2013.01); *H01L 29/42392* (2013.01); *H01L 29/456* (2013.01); *H01L 29/66553* (2013.01); *H01L 29/66742* (2013.01); *H01L 29/78618* (2013.01)

(58) Field of Classification Search
CPC ....... H01L 21/02603; H01L 21/823431; H01L 21/823807; H01L 27/1203
USPC ............... 438/149, 151, 158, 282, 301, 507; 257/24, 29, 192, 213, 347, E21.409, 257/E21.415, E27.112, E29.004, E29.137, 257/E29.286
See application file for complete search history.

(56) References Cited

U.S. PATENT DOCUMENTS

| | | | |
|---|---|---|---|
| 8,450,166 B2 | 5/2013 | Zhang et al. | |
| 8,906,789 B2 | 12/2014 | Tsai et al. | |
| 9,202,920 B1 | 12/2015 | Liu et al. | |
| 9,263,342 B2 | 2/2016 | Lee et al. | |
| 9,431,512 B2* | 8/2016 | Koh ................... | B82Y 10/00 |
| 9,508,829 B1* | 11/2016 | Cheng ............... | H01L 29/66742 |
| 9,653,289 B1* | 5/2017 | Balakrishnan ........ | H01L 27/088 |
| 9,711,608 B1* | 7/2017 | Duriez .............. | H01L 29/42392 |
| 9,842,835 B1* | 12/2017 | Cheng ................. | H01L 27/0629 |
| 2013/0119405 A1 | 5/2013 | Wu et al. | |
| 2014/0151639 A1* | 6/2014 | Chang ............... | H01L 29/42392 257/27 |
| 2016/0020305 A1* | 1/2016 | Obradovic .......... | H01L 29/7391 257/39 |
| 2016/0163796 A1* | 6/2016 | Obradovic ............ | B82Y 10/00 257/9 |
| 2017/0229555 A1* | 8/2017 | Balakrishnan ...... | H01L 29/0673 |

* cited by examiner

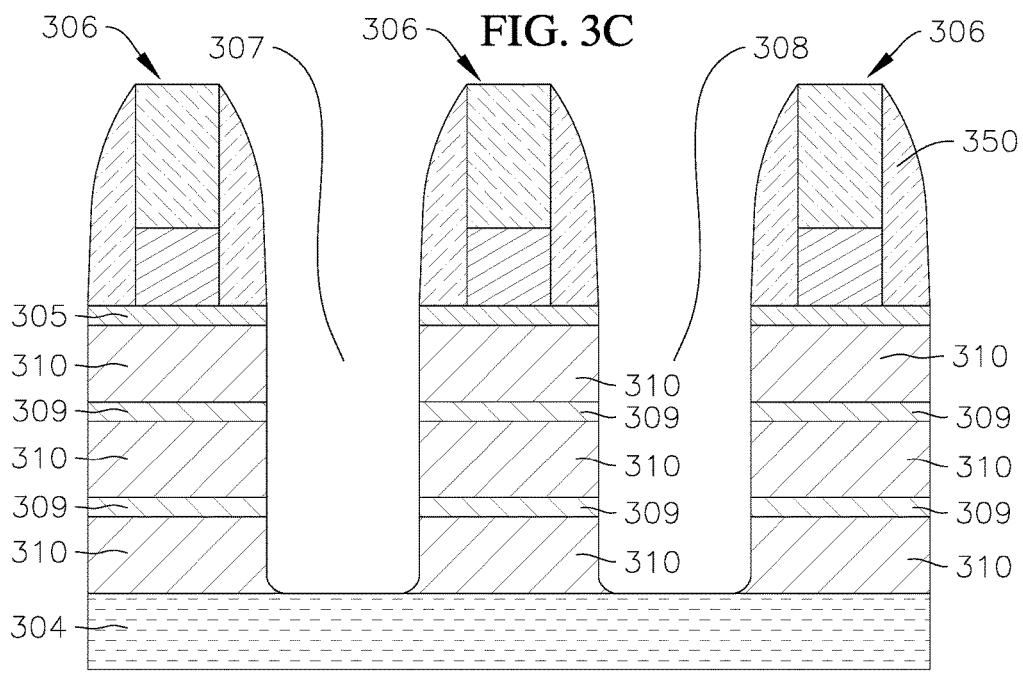
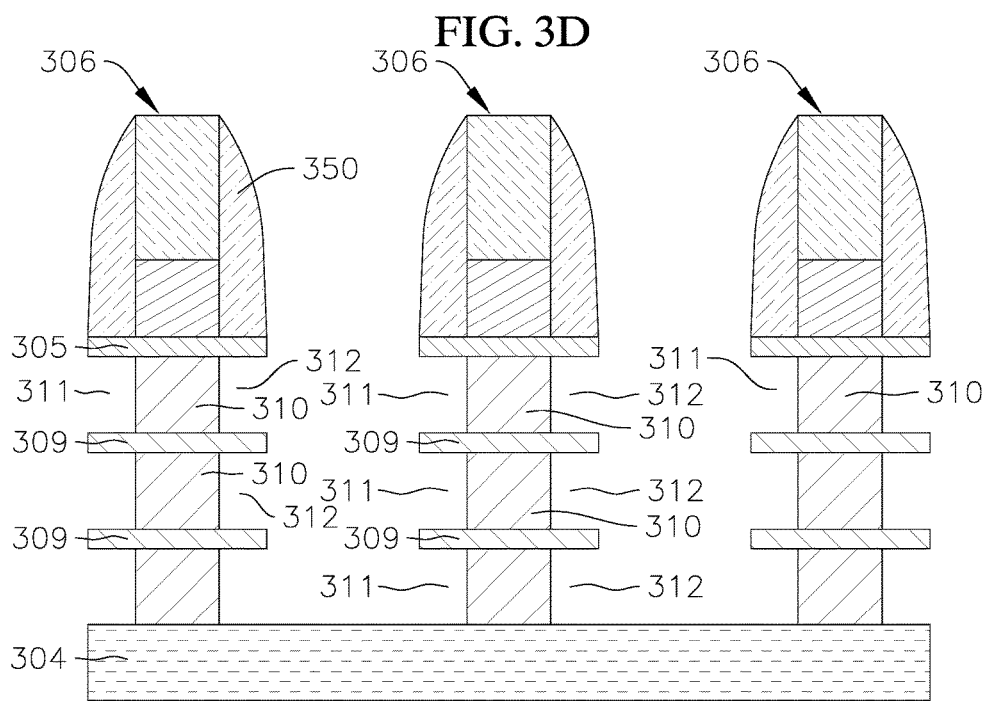

NANOSHEET AND NANOWIRE DEVICES HAVING SOURCE/DRAIN STRESSORS AND METHODS OF MANUFACTURING THE SAME

CROSS-REFERENCE TO RELATED APPLICATION

This application claims priority to and the benefit of U.S. Provisional Application No. 62/311,305 entitled "Structure and Methods to Achieve Effective Source/Drain (SD) Stressors for NS or NW Structures," filed Mar. 21, 2016 in the U.S. Patent and Trademark Office, the entire contents of which are incorporated herein by reference.

FIELD

The present disclosure relates generally to nanosheet and nanowire devices and methods of manufacturing the same.

BACKGROUND

In related art processes for forming nanosheet (NS) or nanowire (NW) devices, a stack of alternating sacrificial layers and channel layers is deposited epitaxially on a single crystal substrate or single crystal underlayer. Related art fabrication flows are used to fabricate the NS or NW structures, including patterning the stack to define the NS or NW widths, and additional processing known in the art to form dummy gates (including a dummy gate oxide) and dummy gate external spacers. The fabrication flow also includes forming source and drain recesses in the stack and then source and drain electrodes are epitaxially regrown in the recesses. Additionally, in related art processes, the source and drain electrodes are epitaxially regrown from several different surfaces, such as the channel layers, the sacrificial layers (if internal spacers are not formed), and the substrate at the bottom of the source and drain recesses. As a result, the source and drain electrodes in related art devices are a merger of regions of epitaxial material grown on several different surfaces. That is, in related art processes of forming NS or NW devices, the epitaxial regrowth of the source and drain electrodes is not performed to promote growth solely or predominantly from the substrate. Because the source and drain electrodes are grown from multiple surfaces, the source and drain electrodes in related art devices are formed without any constraint, or without any significant constraint, in the direction corresponding to the transport direction in the channels (e.g., the source and drain electrodes may be grown with little strain in the transport direction in the channels). This lack of significant strain in the transport direction of the channels negatively affects the performance of the related art NS or NW device.

SUMMARY

The present disclosure is directed to various methods of manufacturing a horizontal nanosheet (hNS) or horizontal nanowire (hNW) device from a stack including an alternating arrangement of sacrificial layers and channel layers on a substrate. In one embodiment, the method includes deep etching portions of the stack to form electrode recesses for a source electrode and a drain electrode, forming conductive passivation layers in the electrode recesses, and epitaxially growing the source and drain electrodes in the electrode recesses. Each conductive passivation layer extends at least partially along a side of one of the electrode recesses. Portions of the substrate at lower ends of the electrode recesses are uncovered by the conductive passivation layers. The source and drain electrodes are grown from the substrate and the conductive passivation layers substantially inhibit the source and drain electrodes from being grown from the channel layers.

The method may also include performing an anisotropic etch to remove portions of the passivation layers covering the substrate at the lower ends of the electrode recesses. The conductive passivation layers may extend completely along the sides of the electrode recesses or may extend only partially along the sides of the electrode recesses. The method may also include laterally recessing the channel layers before the forming of the conductive passivation layers. The method may include annealing or crystallizing the conductive passivation layers. The method may also include performing an etch-back on portions of the sacrificial layers to form internal spacer recesses above and below each of the channel layers, and forming internal spacers in the internal spacer recesses. Each conductive passivation layer comprises a conductive oxide such as $RuO_2$ or oxygen deficient $TiO_2$. Each conductive passivation layer may have a thickness from approximately 0.2 nm to approximately 2 nm, from approximately 0.2 nm to approximately 1 nm, or from approximately 0.2 nm to approximately 0.5 nm. The epitaxially growing the source and drain electrodes in the electrode recesses may include repeatedly forming portions grown from the channel layers and portions grown from the substrate and anisotropically etching to selectively remove the portions grown from the channel layers. The method may also include etching remaining portions of the sacrificial layers to form cavities and depositing gate stacks in the cavities.

The present disclosure is also directed to various embodiments of a horizontal nanosheet or horizontal nanowire device. In one embodiment, the horizontal nanosheet or horizontal nanowire device includes a substrate and at least two horizontal nanosheets or horizontal nanowires stacked on the substrate. Each horizontal nanosheet or horizontal nanowire includes a source electrode, a drain electrode, a gate stack between the source electrode and the drain electrode, and one or more channel regions surrounded by the gate stack and extending between the source electrode and the drain electrode. At least approximately 50% of a volume fraction of each of the source electrode and the drain electrode is strained by registration with the substrate.

In some embodiments, at least approximately 70% of the volume fraction of each of the source electrode and the drain electrode may be strained by registration with the substrate. The horizontal nanosheet or horizontal nanowire device may be an nMOS device, each of the channel regions may include silicon (Si), the substrate may include Si or a silicon-germanium (Si—Ge) alloy, and the source and drain electrodes may each include a silicon-carbon (Si—C) alloy. The horizontal nanosheet or horizontal nanowire device may be a pMOS device, each of the channel regions may include Si or an Si—Ge alloy, the substrate may include Si or an Si—Ge alloy, and the source and drain electrodes may each include an Si—Ge alloy having a higher Ge content than the channel regions and the substrate.

The horizontal nanosheet or horizontal nanowire device may also include conductive passivation layers extending at least partially along edges of the source and drain electrodes. Each of the conductive passivation layers may include a conductive oxide.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

These and other features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

DETAILED DESCRIPTION

Figure 1:
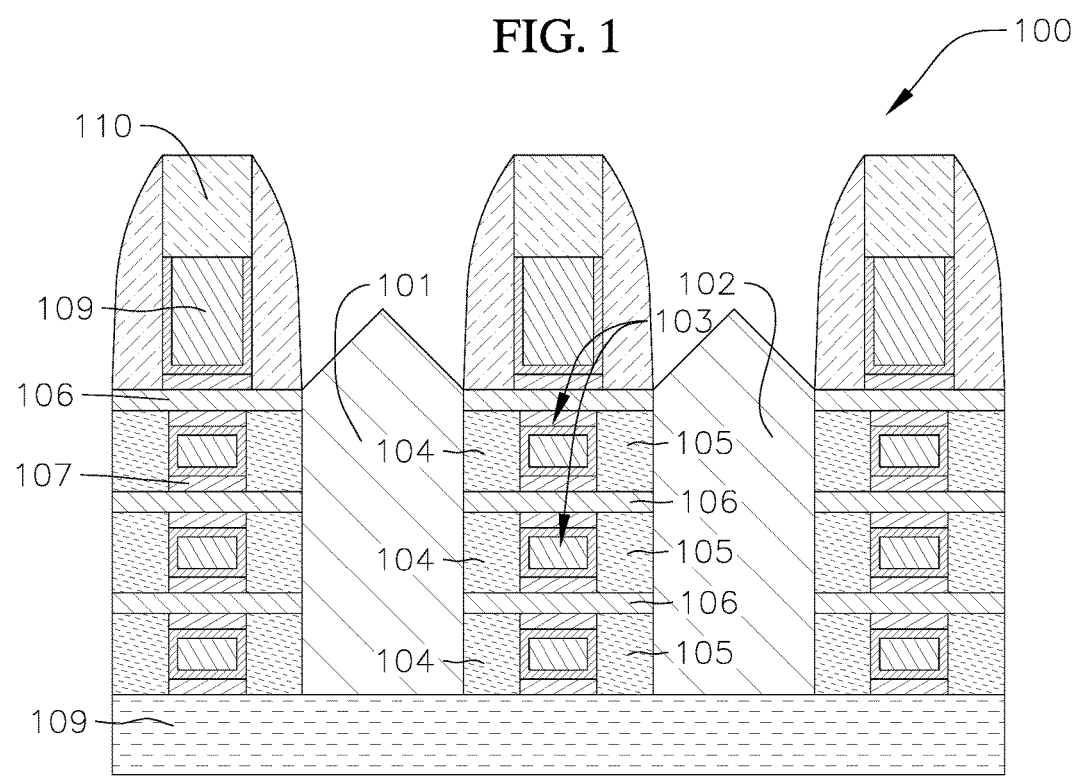
FIG. 1 is a schematic cross-sectional view of a nanosheet (NS) or nanowire (NW) device according to one embodiment of the present disclosure.

The present disclosure is directed to various embodiments of a horizontal nanosheet (hNS) or a horizontal nanowire (hNW) device (e.g., an nMOS device or a pMOS device) and methods of manufacturing the same. According to various embodiments of the present disclosure, a relatively large fraction of the source and drain electrodes of the hNW or hNS device are in epitaxial registration to a bottom substrate or underlayer and are strained in a direction of transport of the channel regions due to the constraint of matching the lattice structure of the substrate. According to various embodiments of the present disclosure, the source and drain electrodes may be formed by repeatedly epitaxially regrowing portions of the source and drain electrodes and subsequently removing (e.g., by anisotropic etching) portions that were grown (e.g., seeded) from layers of the hNS or hNW stack other than the substrate (e.g., removing portions of the source and drain electrodes that were epitaxially grown from the sacrificial layers and/or the channel layers). Additionally, according to various embodiments of the present disclosure, the hNW or hNS device may be formed by deep etching source and drain recesses in a stack, forming conductive passivation layers along sides of the recesses, and then epitaxially regrowing the source and drain electrodes. The conductive passivation layers are configured to inhibit or substantially inhibit growth of the source and drain electrodes from the sacrificial layers and the channels layers, but permit growth from the substrate such that all or substantial volume fractions of the source and drain electrodes are in epitaxial registration to the substrate and are strained by registration to the substrate. Source and drain electrodes that are in registration with the substrate and are substantially strained in the direction of transport in the channel regions are configured to increase the performance of the hNS or hNW device compared to related art hNS or hNW devices in which the source and drain electrodes are not substantially strained to the substrate.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

With reference now to FIG. 1, a horizontal nanosheet (hNS) or horizontal nanowire (hNW) device 100 (e.g., an nMOS device or a pMOS device) according to one embodiment of the present disclosure includes a source electrode 101, a drain electrode 102, a series of gate stacks 103 between the source electrode 101 and the drain electrode 102, a series of first internal spacers 104 between the source electrode 101 and the gate stacks 103, a series of second internal spacers 105 between the drain electrode 102 and the gate stacks 103, and a series of channel regions 106 surrounded by the gate stacks 103 and extending between the source electrode 101 and the drain electrode 102. In the illustrated embodiment, a structure with 3 channel regions 106 is shown, which can be obtained starting from hNS stacks having three channel layers and three sacrificial layers, the top layer of this exemplary hNS stack being a channel layer. Many other embodiments are possible as known in the art. The gate stacks 103 may include interfacial layers 107 in contact with the channel regions 106, high-k dielectric layers 108, metal layers 109, and capping dielectric layers 110 such as nitride layers (which are removed in the regions where the gate electrodes are contacted), as known in the art. In one or more embodiments, the hNS or hNW device 100 may be provided without the first and second internal spacers 104, 105. Additionally, in the illustrated embodiment, the source and drain electrodes 101, 102, the channel regions 106, and the gate stacks 103 are provided on a single crystal substrate or single crystal underlayer 109.

In one or more embodiments, the source and drain electrodes 101, 102 are completely or substantially completely in epitaxial registration to the crystal substrate 109 and are strained or substantially strained in the direction of transport in the channel regions 106 due to the epitaxial registration with the crystal substrate 109 (i.e., the source and drain electrodes 101, 102 are strained in a direction of transport of the channel regions 106 due to the constraint of matching the lattice structure of the substrate 109). In one or more embodiments in which a length (in a direction parallel to the direction of transport in the channel regions 106) of each of the source and drain electrodes 101, 102 is less than approximately 50 nm, at least approximately 70% of the volume fraction of each of the source and drain electrodes 101, 102 is strained by epitaxial registration to the crystal substrate 109. In one or more embodiments in which the length of each of the source and drain electrodes 101, 102 is less than approximately 50 nm, at least approximately 50% of the volume fraction of each of the source and drain electrodes 101, 102 is strained by epitaxial registration to the crystal substrate 109. Straining all or substantial portions of the source and drain electrodes 101, 102 in epitaxial registration with the crystal substrate 109 such that the source and drain electrodes 101, 102 are substantially strained in the direction of transport in the channel regions 106 is configured to increase the performance of the hNS or hNW device 100 compared to related art hNS or hNW devices in which the source and drain electrodes are not substantially strained to the substrate.

Figure 2:
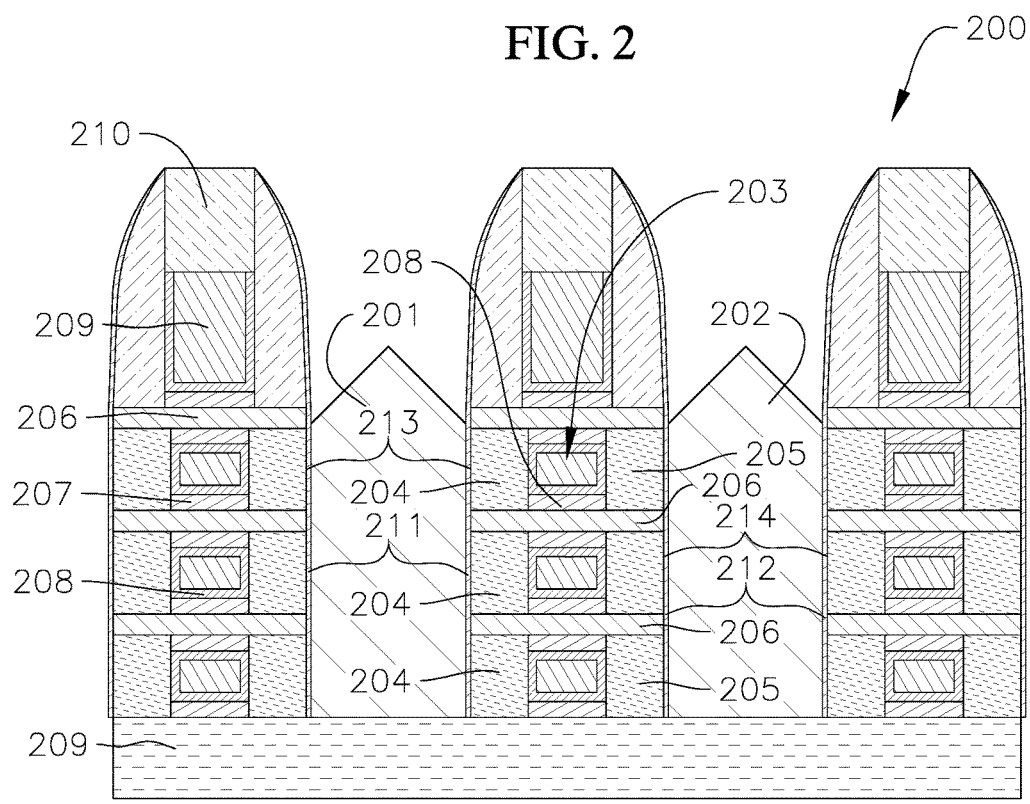
FIG. 2 is a schematic cross-sectional view of a nanosheet (NS) or nanowire (NW) device according to one embodiment of the present disclosure.

With reference now to FIG. 2, a horizontal nanosheet (hNS) or horizontal nanowire (hNW) device 200 (e.g., an nMOS device or a pMOS device) according to another embodiment of the present disclosure includes a source electrode 201, a drain electrode 202, a series of gate stacks 203 between the source electrode 201 and the drain electrode 202, a series of first internal spacers 204 between the source electrode 201 and the gate stacks 203, a series of second internal spacers 205 between the drain electrode 202 and the gate stacks 203, and a series of channel regions 206 under the gate stacks 203 and extending between the source electrode 201 and the drain electrode 202. In the illustrated embodiment, the gate stacks 203 may include interfacial layers 207 in contact with the channel regions 206, high-k dielectric layers 208, metal layers 209, and capping dielectric layers 210 such as nitride layers, as known in the art. In one or more embodiments, the hNS or hNW device 200 may be provided without the first and second internal spacers 204, 205. Additionally, in the illustrated embodiment, the source and drain electrodes 201, 202, the channel regions 206, and the gate stacks 203 are provided on a single crystal substrate or single crystal underlayer 209.

With continued reference to the embodiment illustrated in FIG. 2, the hNS or hNW device 200 also includes conductive passivation layers 211, 212 extending along at least portions of sides 213, 214 of the source and drain electrodes 201, 202, respectively. Additionally, in the illustrated embodiment, at least portions of the crystal substrate 209 underneath the source and drain electrodes 201, 202 are not covered by the conductive passivation layers 211, 212. In the illustrated embodiment, the conductive passivation layers 211, 212 extend up along sides of the channel layers 206 and the internal spacers 204, 205 facing the source and drain electrodes 201, 202. Although in the illustrated embodiment the conductive passivation layers 211, 212 extend completely up along the sides of the source and drain electrodes 201, 202 from the crystal substrate 209, in one or more embodiments, the conductive passivation layers may extend up only along sides of the channel layers 206 facing the source and drain electrodes 201, 202. In one or more embodiments, each conductive passivation layer 211, 212 may be an ultra-thin film having any suitable thickness, such as, for instance, from approximately 0.2 nm to approximately 2 nm. In one or more embodiments, each conductive passivation layer 211, 212 may be an ultra-thin film having a thickness from approximately 0.2 nm to approximately 1 nm. In one or more embodiments, each conductive passivation layer 211, 212 may be an ultra-thin film having a thickness from approximately 0.2 nm to approximately 0.5 nm. In one or more embodiments, the conductive passivation layers 211, 212 may be made out of an oxide having sufficiently high conductive properties, such as, for instance, $RuO_2$ or oxygen deficient $TiO_2$.

As described below with reference to FIGS. 4A-4H, the conductive passivation layers 211, 212 are configured to inhibit or substantially inhibit the source and drain electrodes 201, 202 from growing from surfaces other than the substrate 209, such as the channel regions 206. In some embodiments in which a cyclical deposition-etch process is used to grow the source and drain electrodes 201, 202, the conductive passivation layers 211, 212 may inhibit growth or induce growth of more defective material during the growth portion of the growth-etch cycles, such that the material grown on the conductive passivation layers 211, 212 is removed substantially during the etch portions of the growth-etch cycles while material grown in registration to the underlying substrate or underlayer 209 is not removed or substantially less removed during the etch portions of the growth-etch cycles. Accordingly, in one or more embodiments, the source and drain electrodes 201, 202 are completely or substantially completely in epitaxial registration to the crystal substrate 209 and are strained or substantially strained in the direction of transport in the channel regions 206 due to the epitaxial registration with the crystal substrate 209 (i.e., the source and drain electrodes 201, 202 are strained in a direction of transport of the channel regions 206 due to the constraint of matching the lattice structure of the substrate 209). In one or more embodiments in which a length (in a direction parallel to the direction of transport in the channel regions 206) of each of the source and drain electrodes 201, 202 is less than approximately 50 nm, at least approximately 70% of the volume fraction of each of the source and drain electrodes 201, 202 is strained by registration to the crystal substrate 209. In one or more embodiments in which the length of each of the source and drain electrodes 201, 202 is less than approximately 50 nm, at least approximately 50% of the volume fraction of each of the source and drain electrodes 201, 202 is strained by registration to the crystal substrate 209. Straining all or substantial volume fractions of the source and drain electrodes 201, 202 in registration with the crystal substrate 209 such that the source and drain electrodes 201, 202 are substantially strained in the direction of transport in the channel regions 206 is configured to increase the performance of the hNS or hNW device 200 compared to related art hNS or hNW devices in which the source and drain electrodes are not substantially strained to the substrate.

Figure 3A:
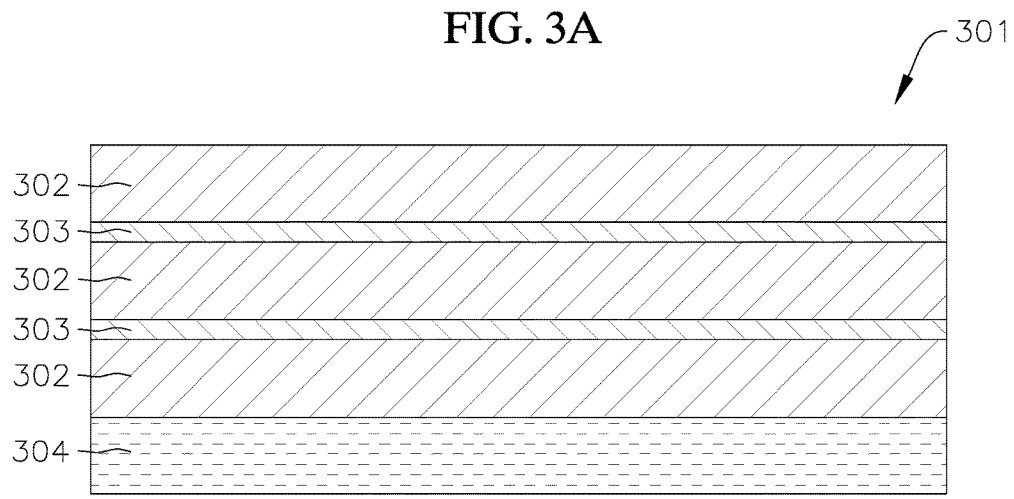
FIGS. 3A-3N depict tasks of a method of forming a NS or NW device according to one embodiment of the present disclosure.
Figure 3B:
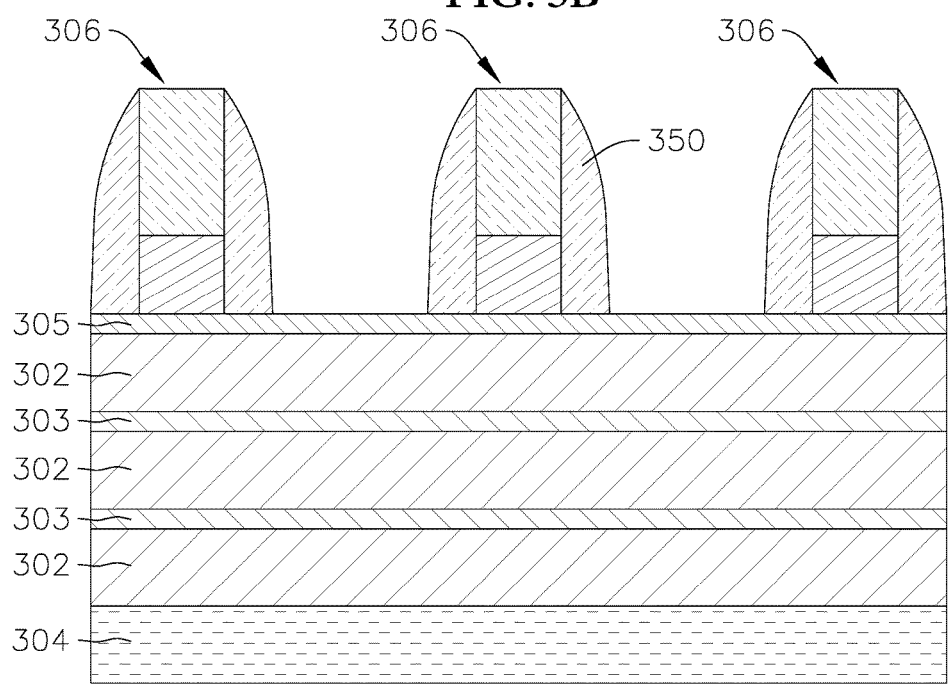
Figure 3E:
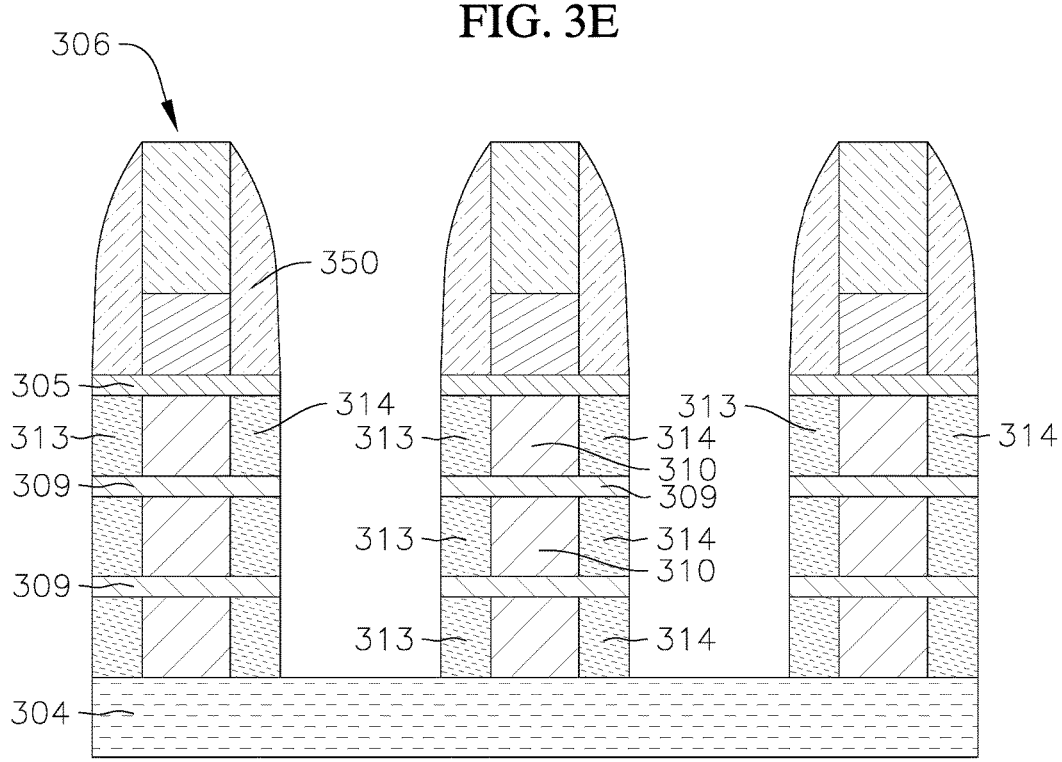
Figure 3F:
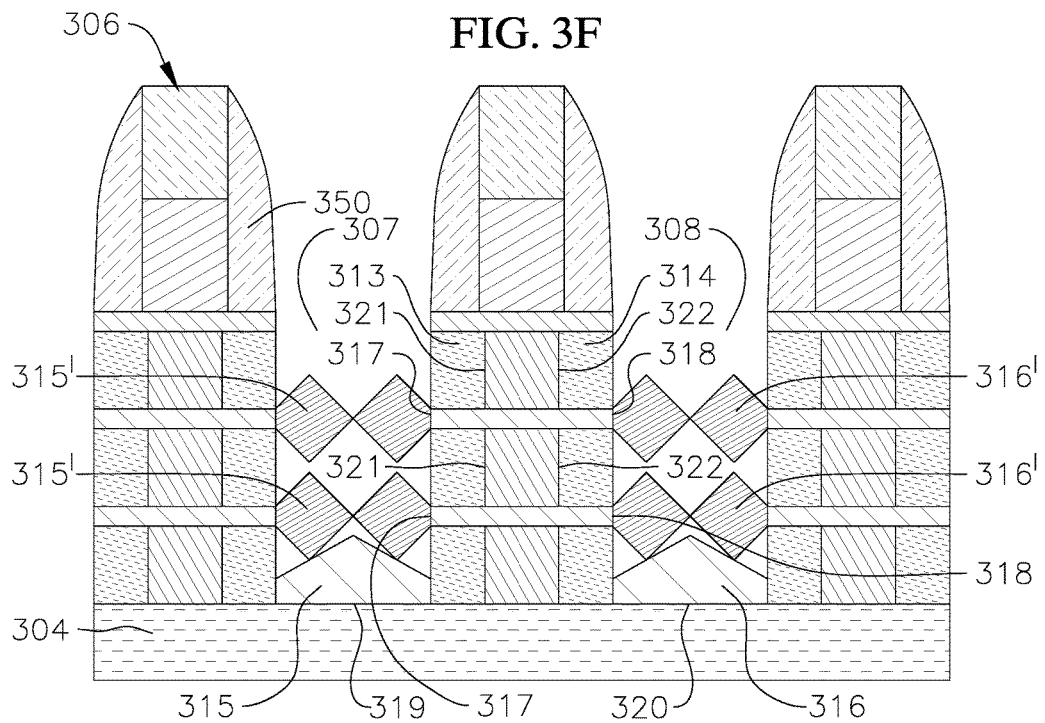
Figure 3G:
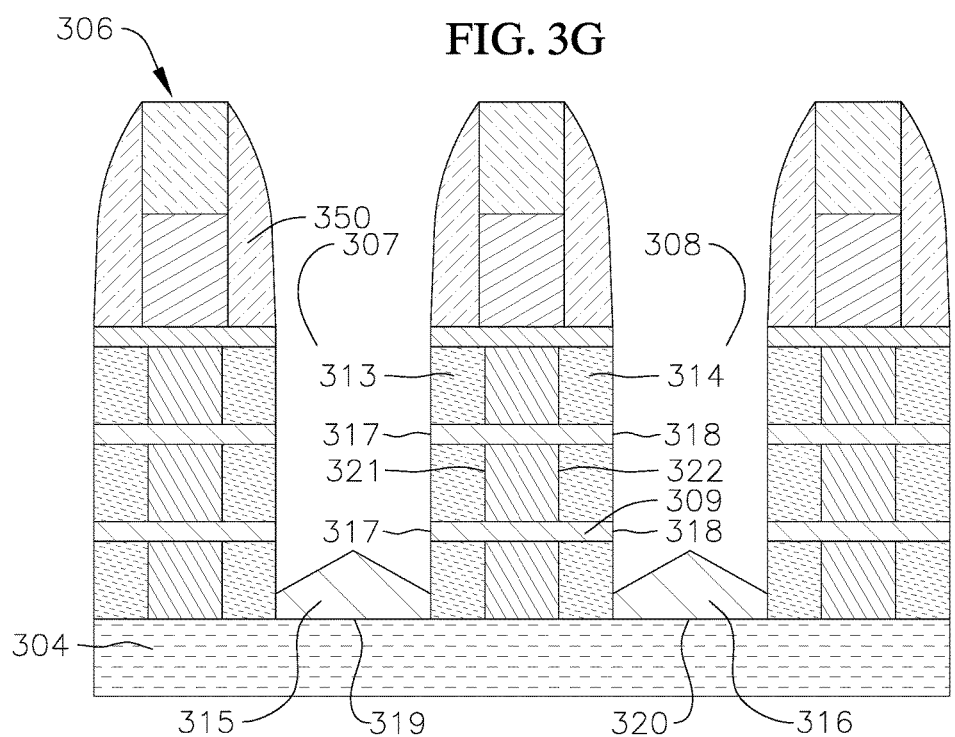
Figure 3H:
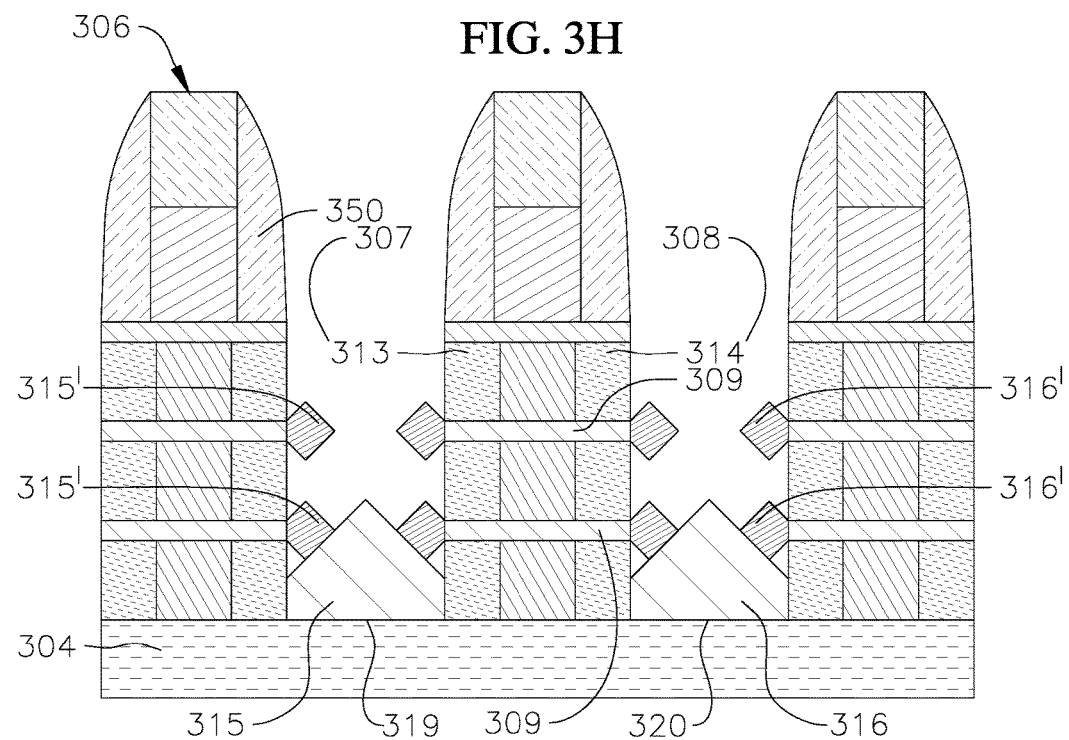
Figure 3I:
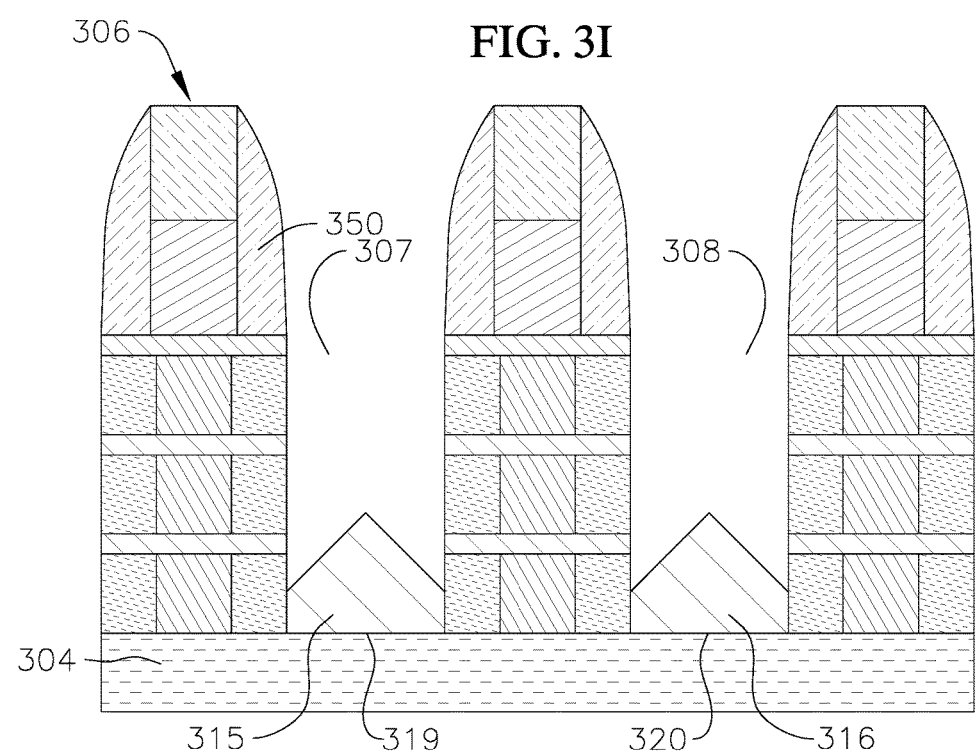
Figure 3J:
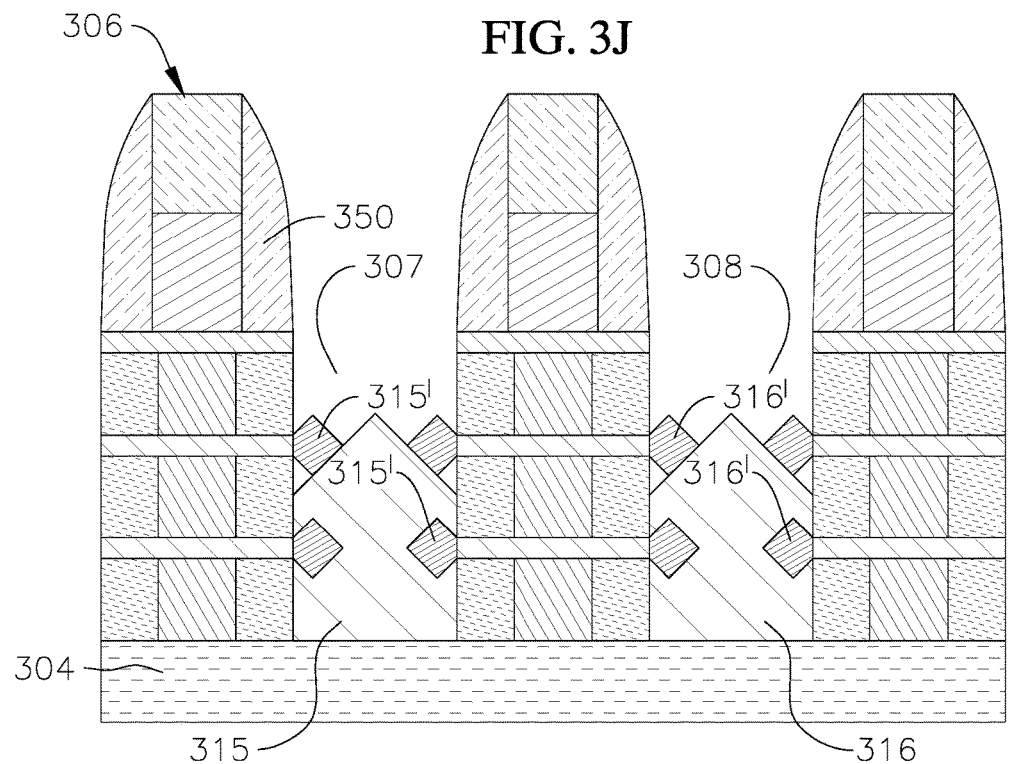
Figure 3K:
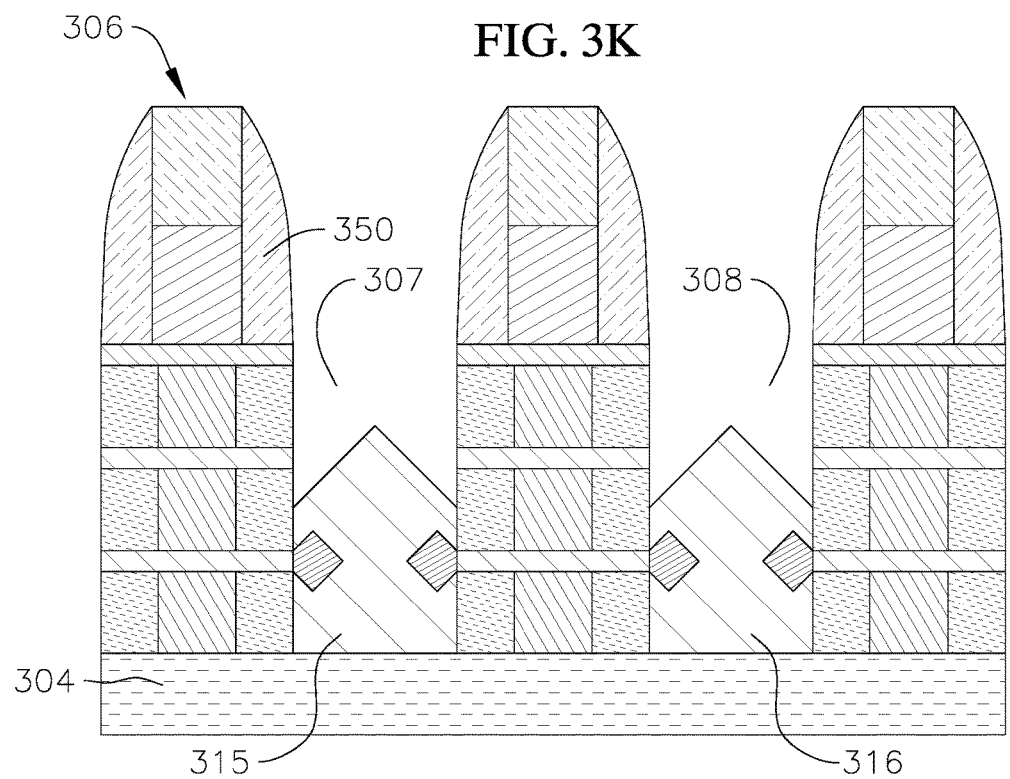
Figure 3L:
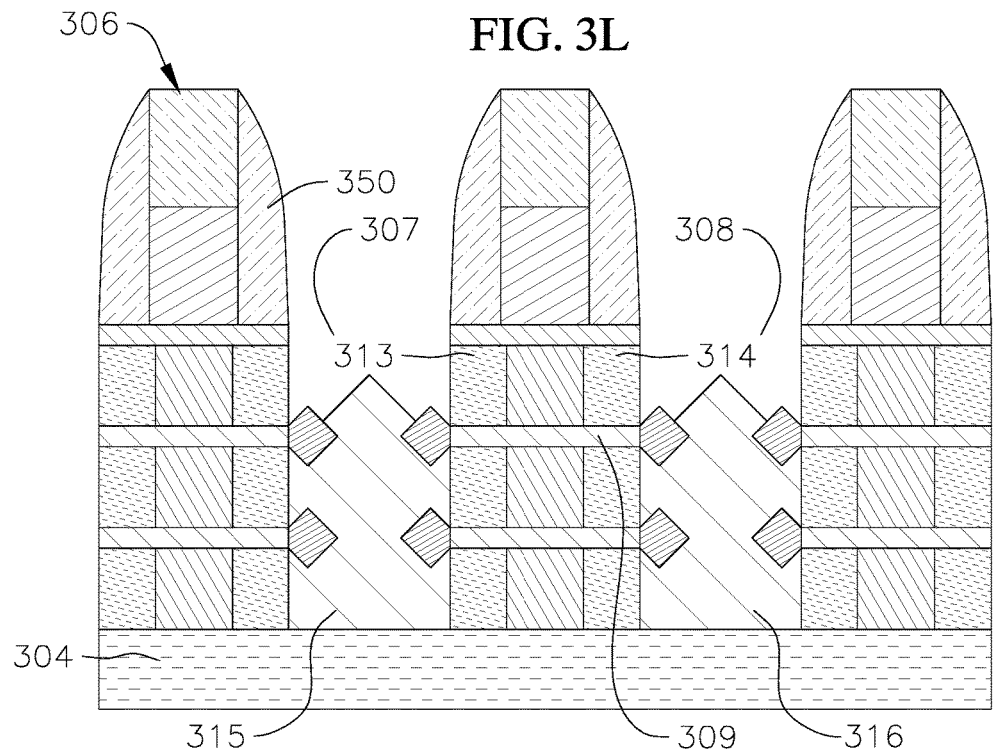
Figure 3M:
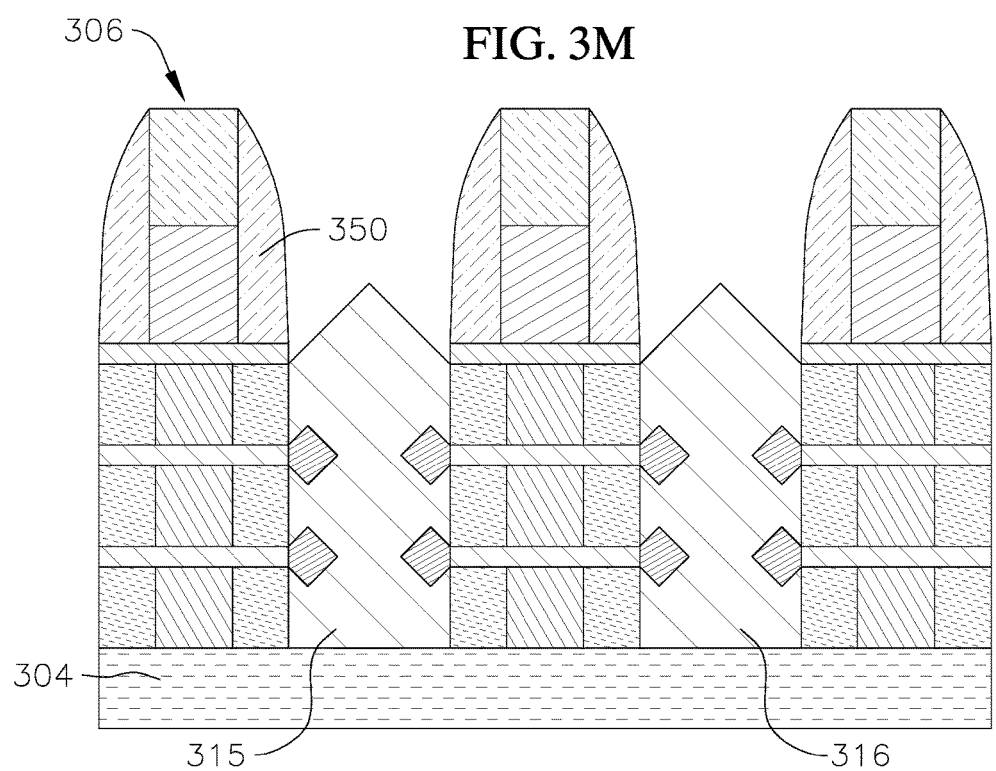
Figure 3N:
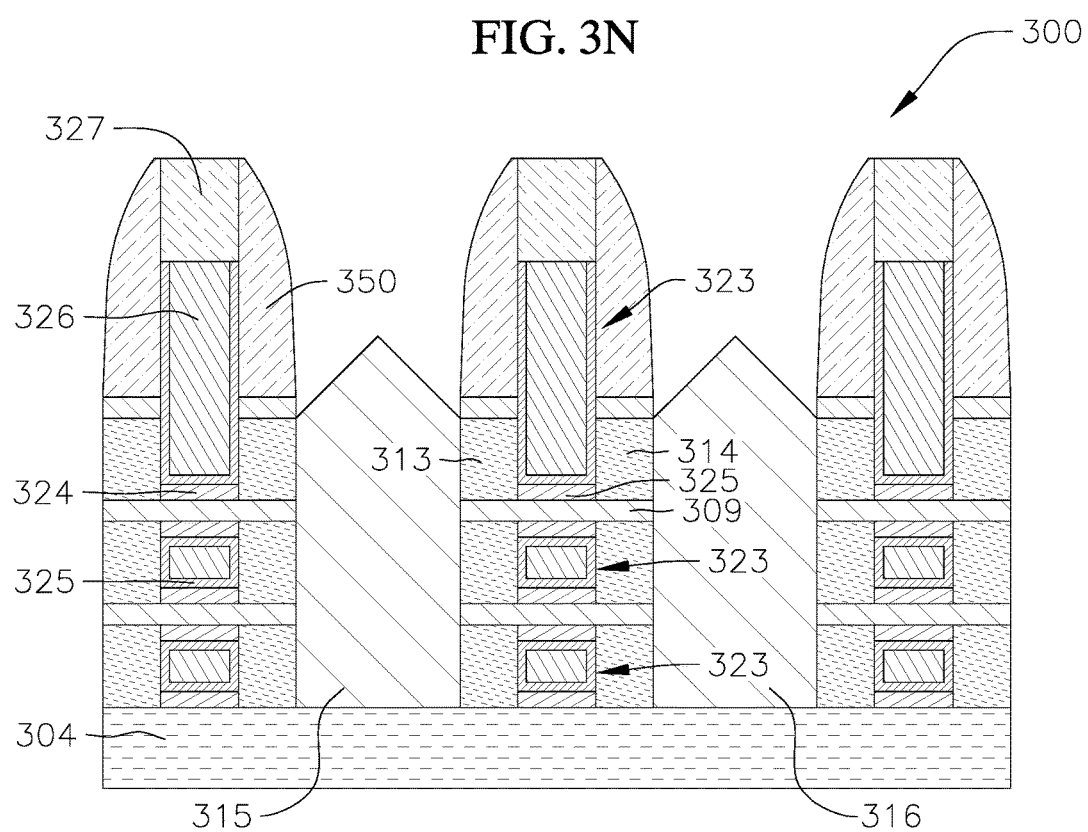

FIGS. 3A-3N depict tasks of a method of forming a horizontal nanosheet (hNS) or horizontal nanowire (hNW) device 300 according to one embodiment of the present disclosure. As illustrated in FIG. 3A, the method of forming the hNS or hNW device 300 according to one embodiment includes forming or obtaining an initial stack 301. In one or more embodiments, the initial stack 301 may be grown from a strain relaxation buffer (SRB). In one or more embodiments, the initial stack 301 may be transferred to an OI wafer using any suitable transfer process known in the art. In the illustrated embodiment, the initial stack 301 includes an alternating arrangement of sacrificial layers 302 and channel layers 303. Although in the illustrated embodiment the initial stack 301 includes three sacrificial layers 302 and two channel layers 303, in one or more embodiments, the initial stack 301 may include any other suitable number of sacrificial layers 302 and channel layers 303 depending on the desired structure of the hNS or hNW device 300. Additionally, in the illustrated embodiment, the initial stack 301 is formed on a single crystal substrate or single crystal underlayer 304 (e.g., the lowermost sacrificial layer 302 is directly on the crystal substrate 304).

With reference now to FIG. 3B, the method of forming the hNS or hNW device 300 according to one embodiment of the present disclosure includes a task of patterning the initial stack 301 to define the NS or NW widths, and forming a dummy gate structure including a dummy gate oxide layer 305, dummy gate electrodes 306 (illustrated, e.g., as a bi-layer in FIG. 3B which may include a bottom amorphous or poly-Si layer and a top dielectric layer such as a nitride) and a series of external spacers 350 on the patterned stack 301. The dummy gate electrodes 306, the external spacers 350, and the dummy gate oxide layer 305 may be formed by any manufacturing technique or process known in the art or hereinafter developed.

With reference now to FIG. 3C, the method of forming the hNS or hNW device 300 according to one embodiment of the present disclosure includes a task of deep etching portions of the stack 301 (e.g., etching to remove portions of the sacrificial layers 302 and channel layers 303) to form electrode recesses 307, 308 for a source electrode and a drain electrode, respectively. In the illustrated embodiment, the portions of the stack 301 that are etched away are located between the external spacers 350 deposited on top of the stack 301, as described above with reference to the task depicted in FIG. 3B. Following the task of deep etching the initial stack 301, the channel layers 303 are separated into channel regions 309 and the sacrificial layers 302 are separated into sacrificial regions 310 above and below the channel regions 309 (i.e., following the deep etch, the stack includes an alternating arrangement of channel regions 309 and sacrificial regions 310 aligned with the channel regions 309). Although in the illustrated embodiment the deep etch is performed through the lowermost sacrificial layer 302, and not etching substantially the substrate 304, in one or more embodiments the deep etch may be performed to slightly different depths, such as also etching a small portion of the substrate 304.

With reference now to FIG. 3D, the method of forming the hNS or hNW device 300 according to one embodiment of the present disclosure includes a task of laterally etching opposite ends of each of the sacrificial regions 310 to form recesses 311, 312 for internal spacers (i.e., performing an etch-back of each of the sacrificial regions 310, selectively with respect to the channel layers 309). During the task of etching, opposite ends of the sacrificial regions 310 are removed laterally, but the channel regions 309 remain substantially intact. Accordingly, following the task of etching the sacrificial regions 310 to form the recesses 311, 312 for the internal spacers, the channel regions 309 extend beyond (e.g., overhang) the sacrificial regions 310. The sacrificial regions 310 may be recessed to any suitable depth depending on the desired thickness of the internal spacers. For example, in one or more embodiments, the opposite ends of the sacrificial regions 310 may each be recessed by approximately 1 nm to approximately 10 nm to accommodate internal spacers having a thickness from approximately 1 nm to approximately 10 nm. The length of the internal spacer recesses 311,312 is also designed to accommodate the appropriate gate length targeted for the hNS devices, which is related to the length of remaining sacrificial layers 310.

With reference now to FIG. 3E, the method of forming the hNS or hNW device 300 according to one embodiment of the present disclosure includes a task of forming internal spacers 313, 314 in the recesses 311, 312, respectively. In one or more embodiments, the hNS or hNW device 300 may be provided without the internal spacers 313, 314. Accordingly, in one or more embodiments, the method of forming the hNS or hNW device 300 according to one or more embodiments of the present disclosure may be performed without laterally etching opposite ends of each of the sacrificial regions 310 to form the recesses 311, 312, as illustrated in FIG. 3D, and without forming the internal spacers 313, 314 in the recesses 311, 312, as illustrated in FIG. 3E With reference now to FIG. 3F, the method of forming the hNS or hNW device 300 according to one embodiment of the present disclosure includes a task of epitaxially regrowing the source electrode 315 and the drain electrode 316 in the recesses 307, 308, respectively, formed during the task of deep etching portions of the initial stack 301, as described above in reference to FIG. 3C. During the task of epitaxially regrowing the source and drain electrodes 315, 316, the source and drain electrodes 315, 316 may be grown from multiple surfaces, such as sides 317, 318 of the channel regions 309 facing the recesses 307, 308, respectively, exposed surfaces 319, 320 of the substrate 304 at the bottoms of the recesses 307, 308, respectively, and, if the internal spacers 313, 314 are not provided, sides 321, 322 of the sacrificial regions 310 facing the recesses 307, 308, respectively.

With reference now to FIG. 3G, the method of forming the hNS or hNW device 300 according to one embodiment of the present disclosure includes a task of preferentially removing (e.g., by anisotropic etching) portions 315', 316' of the source and drain electrodes 315, 316 that were grown by a layer other than the crystal substrate 304 (e.g., etching to remove the portions 315', 316' of the source and drain electrodes 315, 316 that were grown from the sacrificial regions 310 and/or the channel regions 309). Following the task of removing the portions 315', 316' of the source and drain electrodes 315, 316 that were grown by a layer other than the crystal substrate 304, the entirety or substantially the entirety of the remaining portions of the source and drain electrodes 315, 316 will have been grown from the crystal substrate 304. The preferential etch of material grown on the sides of the source and drain recesses 307, 308 is based on known related art techniques of cyclical growth-etch epitaxial processes, and based on the higher defectivity of material grown on the sides of the source and drain recesses 307, 308 compared to the material grown on the bottom of the source and drain recesses 307, 308 and in registration to the crystal substrate 304.

As illustrated in FIGS. 3H-3M, the tasks of epitaxially regrowing portions of the source and drain electrodes 315, 316 and etching to remove the portions 315', 316' of the source and drain electrodes 315, 316 grown from the sacrificial regions 310 and/or the channel regions 309 may be repeatedly performed until, for example, the source and drain electrodes 315, 316 substantially fill the recesses 307, 308. The source and drain electrodes 315, 316 formed in this manner will be completely or substantially completely in epitaxial registration to the substrate 304 and will be strained in the direction of transport in the channel regions 309 due to the epitaxial registration with the substrate 304 (i.e., the source and drain electrodes 319, 320 formed according to this method will be strained in a direction of transport of the channel regions 309 due to the constraint of matching the lattice structure of the substrate 304). In one or more embodiments, at least approximately 70% of the volume fraction of each of the source and drain electrodes 315, 316 is strained by registration to the crystal substrate. In one or more embodiments, at least approximately 50% of the volume fraction of each of the source and drain electrodes 315, 316 is strained by registration to the crystal substrate.

In one or more embodiments in which the hNS or hNW device 300 is an nMOS device and the channel layers 303 are formed of Si, the substrate 304 may be formed of an Si—Ge alloy and the source and drain electrodes 315, 316 may be formed of an Si—Ge alloy having a lower Ge content than the substrate 304. In one or more embodiments in which the hNS or hNW device 300 is an nMOS device and the channel layers 303 are formed of Si, the substrate 304 may be formed of Si or an Si—Ge alloy and the source and drain electrodes 315, 316 may be formed of an Si—C alloy. In one or more embodiments in which the hNS or hNW device 300 is a pMOS device and the channel layers 303 are formed of Si or an Si—Ge alloy, the substrate 304 may be formed of Si or an Si—Ge alloy and the source and drain electrodes 315, 316 may be formed of an Si—Ge alloy having a higher Ge content than the channel layers 303 and the substrate 304.

With continued reference to FIG. 3N, the method of forming the hNS or hNW device 300 according to one embodiment of the present disclosure also includes tasks, known in the related art, of forming and planarizing a dielectric layer such as an oxide, opening a gate cavity by removing the dummy gate electrodes 306 including the dummy gate oxide layer 305 in regions between the external spacers 350, selectively removing the sacrificial regions 310 within the gate cavity (e.g., removing the remainder of each of the sacrificial regions 310 by selective etching), and forming or depositing a gate stack 323 including an interfacial layer 324 in contact with the channel region 309, a high-k dielectric layer 325, and a metal layer 326 for each channel region 309. The gate stacks 323 are formed or deposited in regions that were previously occupied by the sacrificial regions 310 extending laterally between the internal spacers 313, 314 (if formed) or between the source and drain electrodes 315, 316 (if the internal spacers 313, 314 were not formed) (i.e., the gate stacks 323 are deposited in cavities that were formed during the task of selectively etching the sacrificial regions 310). The task of forming or depositing the gate stacks 323 may be performed by any suitable replacement metal gate (RMG) process now known or hereinafter developed. In the illustrated embodiment, the gate stacks 323 include dielectric capping layers 327, such as nitrides (which will be removed in subsequent tasks of the fabrication process in the regions where the gates are contacted).

FIGS. 4A-4H depict tasks of a method of forming a horizontal nanosheet (hNS) or horizontal nanowire (hNW) device 400 according to another embodiment of the present disclosure.

With reference to FIGS. 4A-4E, the method according to one embodiment of the present disclosure includes a task of forming or obtaining an initial stack 401 including an alternating arrangement of sacrificial layers 402 and channel layers 403 on a single crystal substrate or single crystal underlayer 404, patterning the stack 401 to define the NS or NW widths, and forming a dummy structure including a dummy gate oxide layer 405, a series of dummy gate electrodes 406 (each dummy gate electrode 406 including, for example, a bottom amorphous or poy-Si layer and a top dielectric layer such as a nitride), and a series of external spacers 450 on the initial stack 401, deep etching portions of the initial stack 401 to form electrode recesses 407, 408 for a source electrode and a drain electrode, respectively, and, optionally, laterally etching opposite ends of each sacrificial regions 410 to form recesses 411, 412 for internal spacers and depositing the internal spacers 413, 414 in the recesses 411, 412, respectively. The tasks illustrated in FIGS. 4A-4E may be the same or substantially the same as the tasks described above with reference to FIGS. 3A-3E.

Figure 4A:
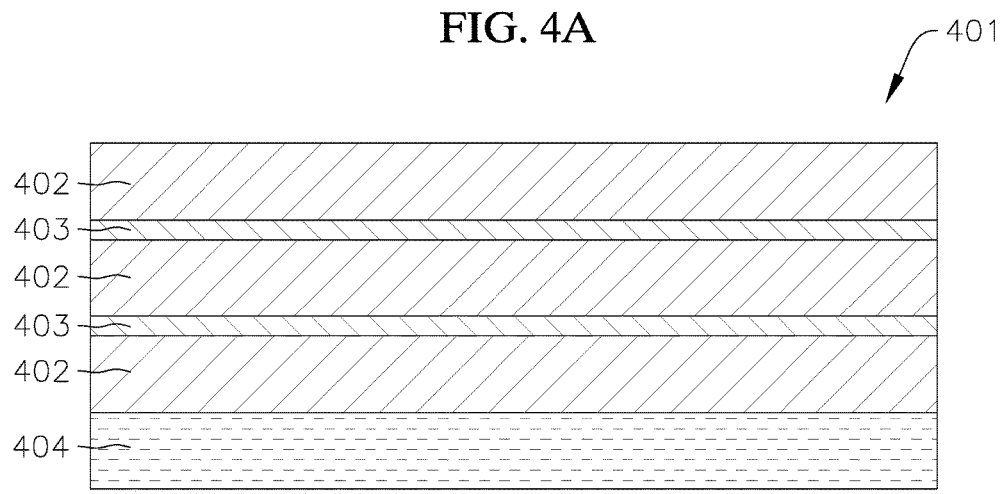
FIGS. 4A-4H depict tasks of a method of forming a NS or NW device according to one embodiment of the present disclosure.
Figure 4B:
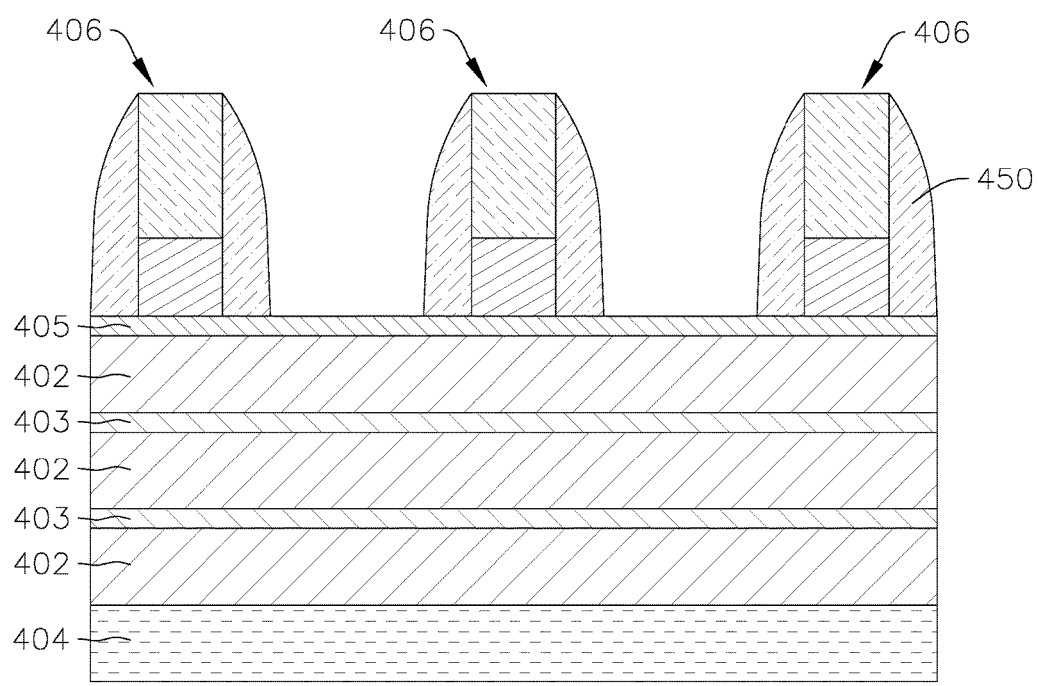
Figure 4C:
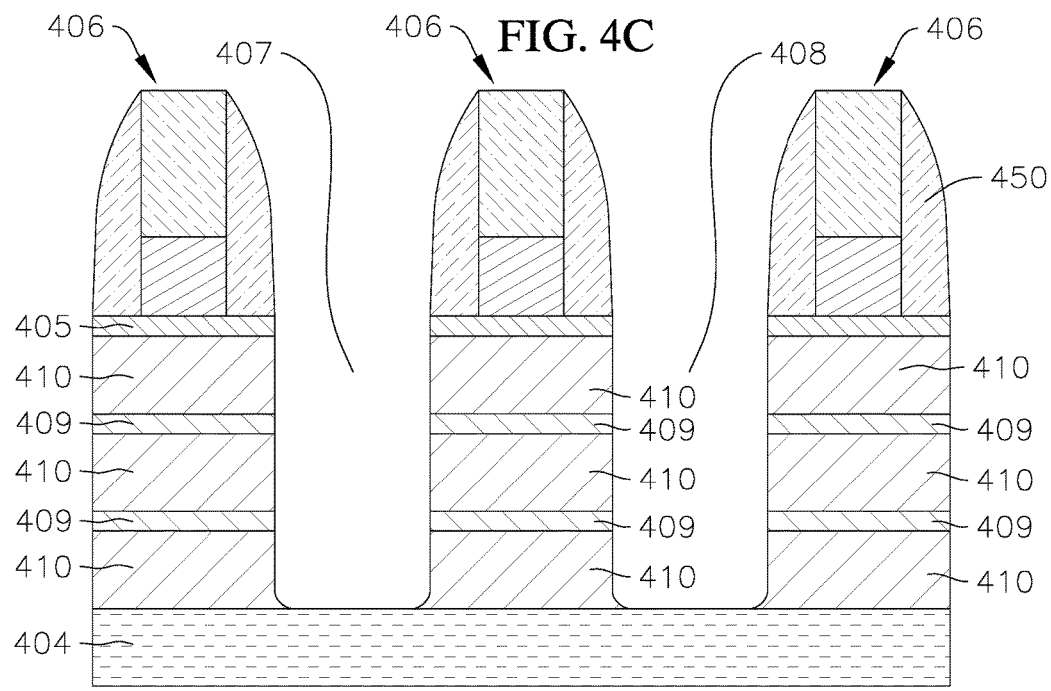
Figure 4D:
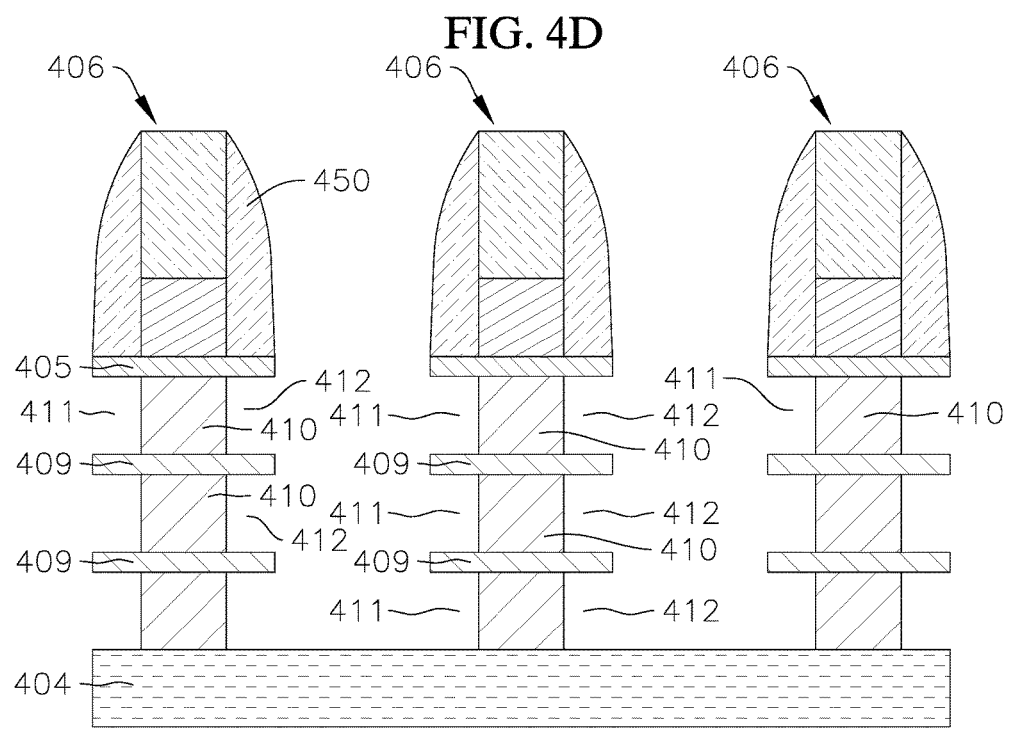
Figure 4E:
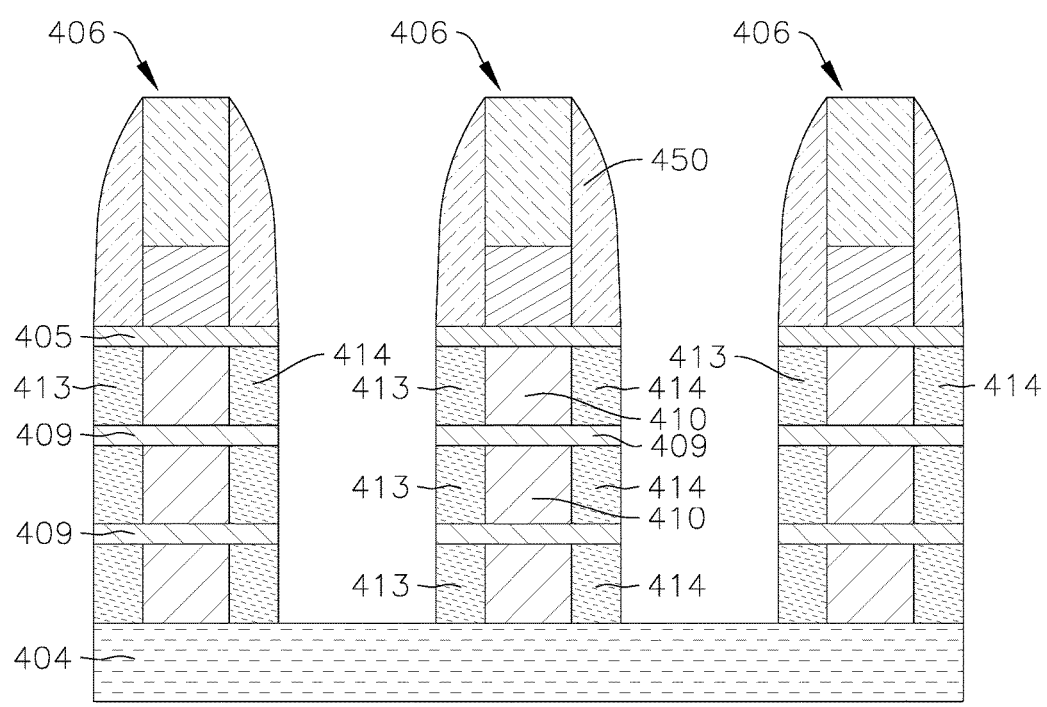
Figure 4F:
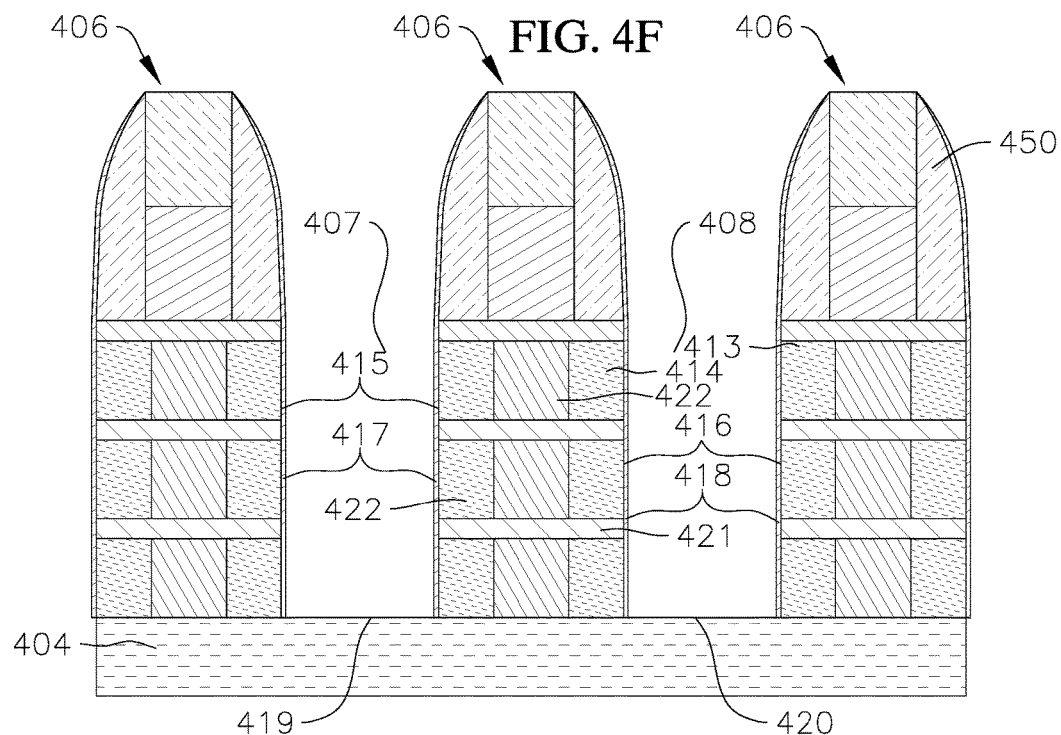

With reference now to FIG. 4F, the method of forming the hNS or hNW device 400 according to one embodiment of the present disclosure includes a task of forming conductive passivation layers 415, 416 in the electrode recesses 407, 408, respectively. In the illustrated embodiment, the conductive passivation layers 415, 416 extend up along sides 417, 418 of the electrode recesses 407, 408, respectively, but at least portions 419, 420 of the crystal substrate 404 at the bottom of each of the electrode recesses 407, 408, respectively, is exposed (i.e., the portions 419, 420 of the crystal substrate 404 at the bottoms of the electrode recesses 407, 408 are uncovered or substantially uncovered by the conductive passivation layers 415, 416). In the illustrated embodiment, the conductive passivation layers 415, 416 extend up along sides of channel regions 421 and the internal spacers 413, 414 facing the electrode recesses 407, 408. In one or more embodiments in which the hNS or hNW device 400 is provided with the internal spacers 413, 414, the conductive passivation layers 415, 416 may extend only along the sides of the channel regions 421 (i.e., the conductive passivation layers 415, 416 may not be provided on the sides of the internal spacers 413, 414). In one or more embodiments, each conductive passivation layer 415, 416 may be an ultra-thin film having any suitable thickness, such as, for instance, from approximately 0.2 nm to approximately 2 nm. In one or more embodiments, each conductive passivation layer 415, 416 may be an ultra-thin film having a thickness from approximately 0.2 nm to approximately 1 nm. In one or more embodiments, each conductive passivation layer 415, 416 may be an ultra-thin film having a thickness from approximately 0.2 nm to approximately 0.5 nm. In one or more embodiments, the conductive passivation layers 415, 416 may be made out of an oxide having sufficiently high conductive properties, such as, for instance, $RuO_2$ or oxygen deficient $TiO_2$. The task of forming the conductive passivation layers 415, 416 in the electrode recesses 407, 408 may be performing by any suitable manufacturing technique or process, such as, for instance, a conformal deposition process such as atomic layer deposition (ALD). Additionally, in one or more embodiments, the task of forming the conductive passivation layers 415, 416 may include a task of performing an anisotropic etch to selectively remove any conductive passivation material on the portions 419, 420 of the substrate 404 at the bottoms of the electrode recesses 407, 408, but retaining the conductive passivation material on the sides 417, 418 of the electrode recesses 407, 408. Due to the anisotropic nature of the etch, the conductive passivation materials remain only on the sides 417, 418 of the electrode recesses 407, 408 following the task of performing the anisotropic etch. In one or more embodiments, the task may also include removing or substantially removing the conductive passivation layers 415, 416 from the sides 417, 418 of the electrode recesses 407, 408 except for along the channel regions 421 (e.g., the task may include selectively removing the conductive passivation layers 415, 416 from the internal spacers 413, 414). Additionally, in one or more embodiments, the task of forming the conductive passivation layers 415, 416 in the electrode recesses 407, 408 may include a task of annealing or crystallizing the conductive passivation layers 415, 416 (e.g., the ultra-thin oxide films) at a relatively moderate temperature.

In one or more embodiments, method may include a task of laterally recessing portions of the channel regions 421 facing the electrode recesses 407, 408 before the task of forming the conductive passivation layers 415, 416. The method may also include a task of recessing portions of the internal spacers 413, 414 facing the electrode recesses 407, 408 or, if the internal spacers 413, 414 are not formed, recessing portions of the sacrificial regions 422 facing the electrode recesses 407, 408 prior to the task of forming the conductive passivation layers 415, 416 in the electrode recesses 407, 408. The task of laterally recessing portions of the channel regions 421 and the internal spacers 413, 414 (or the sacrificial regions 422 if the internal spacers 413, 414 are not formed) may be performed by an etch-back. Following the task of recessing the channel regions 421 and the internal spacers 413, 414 (or the sacrificial regions 422 if the internal spacers 413, 414 are not formed), the conductive passivation layers 415, 416 may be formed in the recesses formed in the channel regions 421 and the internal spacers 413, 414 or the sacrificial regions 422. The channel regions 421 and the internal spacers 413, 414 or the sacrificial regions 422 may be laterally recessed to any suitable depth depending on the desired thickness of the conductive passivation layers 415, 416. In one embodiment in which only the channel regions 421 are recessed (e.g., the internal spacers 413, 414 and the sacrificial regions 422 are not recessed), the conductive passivation layers 415, 416 may be formed only along the sides of the channel regions 421 facing the electrode recesses 407, 408. In one embodiment in which the channel regions 421 and the internal spacers 413, 414 (or the sacrificial regions 422, if the internal spacers 413, 414 are not provided) are recessed, the conductive passivation layers 415, 416 may be formed entirely or substantially entirely along the sides 417, 418 of the electrode recesses 407, 408.

Figure 4G:
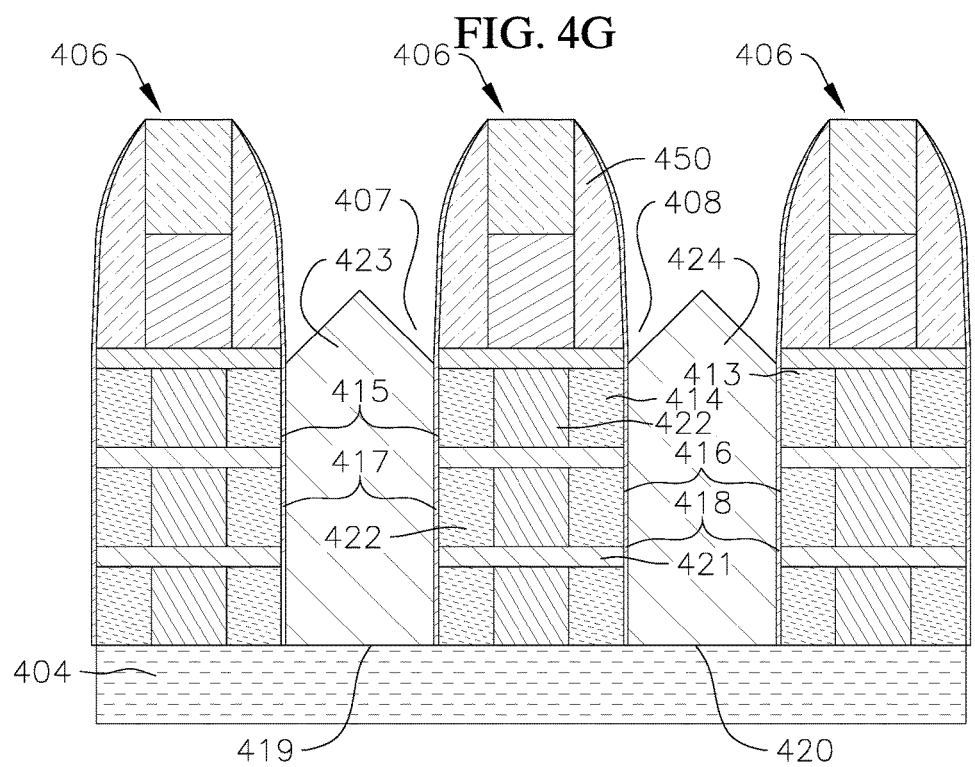

With reference now to FIG. 4G, the method of forming the hNS or hNW device 400 according to one embodiment of the present disclosure includes a task of epitaxially re-growing a source electrode 423 and a drain electrode 424 in the electrode recesses 407, 408, respectively, formed during the task of deep etching portions of the initial stack 401, as described above in reference to FIG. 4C. The conductive passivation layers 415, 416 along the sides 417, 418 of the electrode recesses 407, 408 are configured to inhibit or substantially inhibit the source and drain electrodes 423, 424 from epitaxially growing from the channel regions 421 and the sacrificial regions 422. However, because the portions 419, 420 of the crystal substrate 404 at the bottoms of the electrode recesses 407, 408 are uncovered by the conductive passivation layers 415, 416 (i.e., the crystal substrate 404 is exposed at the bottoms of the electrode recesses 407, 408), the source and drain electrodes 423, 424 epitaxially grow from the crystal substrate 404 during the task of epitaxially re-growing the source and drain electrodes 423, 424. Growing the source and drain electrodes 423, 424 from the crystal substrate 404 while inhibiting or substantially inhibiting growth of the source and drain electrodes 423, 424 from the channel regions 421 with the conductive passivation layers 415, 416 results in all or substantially all of the source and drain electrodes 423, 424 being in epitaxial registration with the crystal substrate 404 and strained in a direction of transport of the channel regions 421 due to the constraint of matching the lattice structure of the crystal substrate 404, which improves performance of the hNS or hNW device 400 compared to related art hNS or hNW devices. In one or more embodiments, at least approximately 70% of the volume fraction of each of the source and drain electrodes 423, 424 is strained by registration to the crystal substrate 404. In one or more embodiments, at least approximately 50% of the volume fraction of each of the source and drain electrodes 423, 424 is strained by registration to the crystal substrate 404.

Additionally, the task of epitaxially regrowing the source and drain electrodes 423, 424 is performed at a limited temperature such that the epitaxial regrowth process does not degrade the conductive passivation layers 415, 416. Suitable temperatures for the epitaxial regrowth process depend, at least in part, on the thermal stability of the materials of the conductive passivation layers 415, 416. Otherwise, degradation of the conductive passivation layers 415, 416 could occur with thermal budgets that are too high.

In one or more embodiments, the method may include a task of forming a thin epitaxial layer in the electrode recesses 407, 408 prior to the task of forming the conductive passivation layers 415, 416 in the electrode recesses 407, 408.

In one or more embodiments, the task of epitaxially regrowing the source and drain electrodes 423, 424 may include a task of preferentially removing (e.g., by anisotropic etching) any portions of the source and drain electrodes 423, 424 grown from a surface other than the substrate 404 (e.g., anisotropically etching to remove portions of the source and drain electrodes 423, 424 that were grown from the channel regions 421). For example, in one or more embodiments, the task of epitaxially regrowing the source and drain electrodes 423, 424 may include tasks of repeatedly epitaxially growing portions of the source and drain electrodes 423, 424 and selectively removing any portions of the source and drain electrodes 423, 424 not grown from the substrate 404, as described above with reference to FIGS. 3F-3M.

Figure 4H:
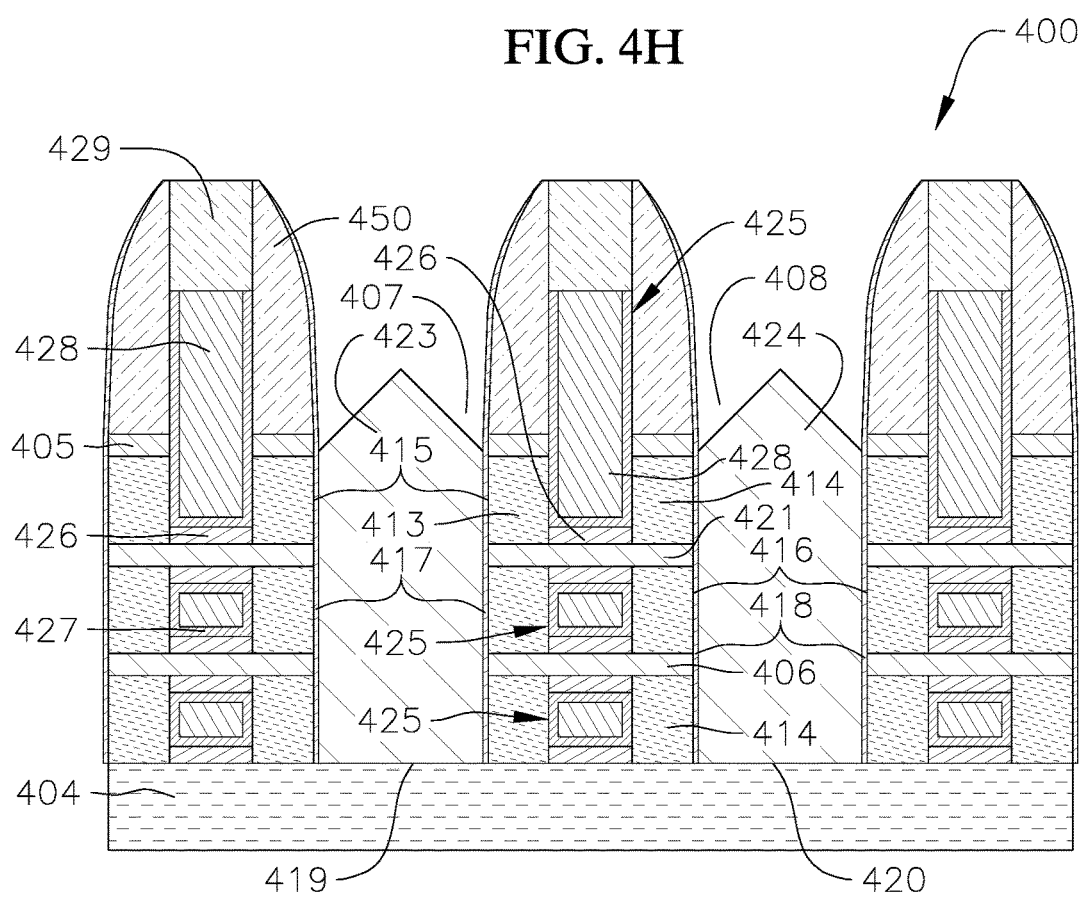

With reference now to FIG. 4H, the method of forming the hNS or hNW device 400 according to one embodiment of the present disclosure includes a task of selectively etching the remainder of each of the sacrificial regions 422 (i.e., the method includes removing the remainder of each of the sacrificial regions 422 by selective etching). Following the task of selectively etching the sacrificial regions 422, the internal spacers 413, 414 (if provided), and the channel regions 421 remain intact.

With continued reference to FIG. 4H, the method of forming the hNS or hNW device 400 according to one embodiment of the present disclosure also includes tasks, known in the related art, of forming and planarizing a dielectric layer such as an oxide, opening a gate cavity by removing the dummy gate electrodes 406 including the dummy gate oxide layer 405 in regions between the external spacers 450, selectively removing the sacrificial regions 410 within the gate cavity (e.g., removing the remainder of each of the sacrificial regions 410 by selective etching), and forming or depositing a gate stack 425 including an interfacial layer 426, a high-k dielectric layer 427, and a metal layer 428 for each channel region 421. The gate stacks 425 are formed or deposited in regions that were previously occupied by the sacrificial regions 422 extending laterally between the internal spacers 413, 414 (if formed) or between the source and drain electrodes 423, 424 (if the internal spacers 413, 414 were not formed) (i.e., the gate stacks 425 are deposited in cavities that were formed during the task of selectively etching the sacrificial regions 422). The task of forming or depositing the gate stacks 425 may be performed by any suitable replacement metal gate (RMG) process now known or hereinafter developed. In the illustrated embodiment, the gate stacks 425 include dielectric capping layers 429, such as nitrides (which will be removed in subsequent tasks of the fabrication process in the regions where the gates are contacted).

What is claimed is:

1. A method of manufacturing a nanosheet or nanowire device from a stack comprising an alternating arrangement of sacrificial layers and channel layers on a substrate, the method comprising:
   deep etching portions of the stack to form electrode recesses for a source electrode and a drain electrode; and
   forming conductive passivation layers in the electrode recesses, each conductive passivation layer extending at least partially along a side of one of the electrode recesses, wherein portions of the substrate at lower ends of the electrode recesses are uncovered by the conductive passivation layers; and
   epitaxially growing the source and drain electrodes in the electrode recesses, wherein the source and drain electrodes are grown from the substrate and wherein the conductive passivation layers substantially inhibit the source and drain electrodes from being grown from the channel layers.

2. The method of claim 1, further comprising performing an anisotropic etch to remove portions of the passivation layers covering the substrate at the lower ends of the electrode recesses.

3. The method of claim 1, wherein the conductive passivation layers extend completely along sides of the electrode recesses.

4. The method of claim 1, wherein the conductive passivation layers extend only partially along sides of the electrode recesses.

5. The method of claim 1, further comprising laterally recessing the channel layers before the forming of the conductive passivation layers.

6. The method of claim 1, further comprising annealing or crystallizing the conductive passivation layers.

7. The method of claim 1, further comprising:
   performing an etch-back on portions of the sacrificial layers to form internal spacer recesses above and below each of the channel layers; and
   forming internal spacers in the internal spacer recesses.

8. The method of claim 1, wherein each conductive passivation layer comprises a conductive oxide.

9. The method of claim 8, wherein the conductive oxide is $RuO_2$ or oxygen deficient $TiO_2$.

10. The method of claim 1, wherein each conductive passivation layer has a thickness from approximately 0.2 nm to approximately 2 nm.

11. The method of claim 1, wherein each conductive passivation layer has a thickness from approximately 0.2 nm to approximately 1 nm.

12. The method of claim 1, wherein each conductive passivation layer has a thickness from approximately 0.2 nm to approximately 0.5 nm.

13. The method of claim 1, wherein the epitaxially growing the source and drain electrodes in the electrode recesses comprises repeatedly forming portions grown from the channel layers and portions grown from the substrate and anisotropically etching to selectively remove the portions grown from the channel layers.

14. The method of claim 1, further comprising:
   etching remaining portions of the sacrificial layers to form cavities; and
   depositing gate stacks in the cavities.

15. A method of manufacturing a nanosheet or nanowire device from a stack comprising an alternating arrangement of sacrificial layers and channel layers on a substrate, the method comprising:
- deep etching portions of the stack to form electrode recesses for a source electrode and a drain electrode; and
- forming conductive passivation layers in the electrode recesses, each conductive passivation layer extending at least partially along a side of one of the electrode recesses, wherein portions of the substrate at lower ends of the electrode recesses are uncovered by the conductive passivation layers; and
- epitaxially growing the source and drain electrodes in the electrode recesses,
- wherein the source and drain electrodes are grown from the substrate and wherein the conductive passivation layers substantially inhibit the source and drain electrodes from being grown from the channel layers, and
- wherein the epitaxially growing the source and drain electrodes in the electrode recesses comprises repeatedly growing portions of the source and drain electrodes and anisotropically etching to selectively remove any portions grown from the channel layers.

* * * * *